(12) United States Patent
Mazumder et al.

(10) Patent No.: US 11,727,979 B2
(45) Date of Patent: Aug. 15, 2023

(54) METHODS OF REDUCING CLOCK DOMAIN CROSSING TIMING VIOLATIONS, AND RELATED DEVICES AND SYSTEMS

(71) Applicant: Micron Technology, Inc., Boise, ID (US)

(72) Inventors: Kallol Mazumder, Boise, ID (US); Navya Sri Sreeram, Boise, ID (US); William C. Waldrop, Boise, ID (US); Vijayakrishna J. Vankayala, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 27 days.

(21) Appl. No.: 17/369,055

(22) Filed: Jul. 7, 2021

(65) Prior Publication Data
US 2023/0007872 A1 Jan. 12, 2023

(51) Int. Cl.
| | | |
|---|---|---|
| *G11C 7/22* | (2006.01) |
| *G11C 11/4076* | (2006.01) |
| *G11C 11/4096* | (2006.01) |
| *G06F 3/06* | (2006.01) |
| *G11C 7/10* | (2006.01) |

(52) U.S. Cl.
CPC ........ *G11C 11/4076* (2013.01); *G06F 3/0604* (2013.01); *G06F 3/0659* (2013.01); *G06F 3/0679* (2013.01); *G11C 7/1093* (2013.01); *G11C 7/222* (2013.01); *G11C 11/4096* (2013.01); *G11C 2207/2254* (2013.01)

(58) Field of Classification Search
CPC .... G06F 3/0604; G06F 3/0659; G06F 3/0679; G11C 11/4096; G11C 11/4076
See application file for complete search history.

(56) References Cited

U.S. PATENT DOCUMENTS

| | | | |
|---|---|---|---|
| 6,434,684 B1* | 8/2002 | Manning | H04L 7/02 713/400 |
| 8,914,761 B2* | 12/2014 | Ly | G06F 30/33 716/113 |
| 2006/0120498 A1* | 6/2006 | Wong | H04L 7/0012 375/359 |
| 2018/0247683 A1* | 8/2018 | Lee | G11C 7/109 |
| 2019/0163653 A1* | 5/2019 | Kim | G06F 13/1689 |
| 2020/0111523 A1* | 4/2020 | Lee | H01L 25/0652 |
| 2021/0241813 A1* | 8/2021 | Penney | G11C 11/4076 |

* cited by examiner

*Primary Examiner* — Mushfique Siddique
(74) *Attorney, Agent, or Firm* — TraskBritt

(57) ABSTRACT

Methods of operating a memory device are disclosed. A method may include asserting, at a semiconductor device, an internal signal in response to receipt of a command. The method may also include holding the internal signal in an asserted state for at least a predetermined time duration upon assertion of the internal signal. Further, the method may include generating an enable signal based on the internal signal and a clock signal. Associated devices and systems are also disclosed.

20 Claims, 13 Drawing Sheets

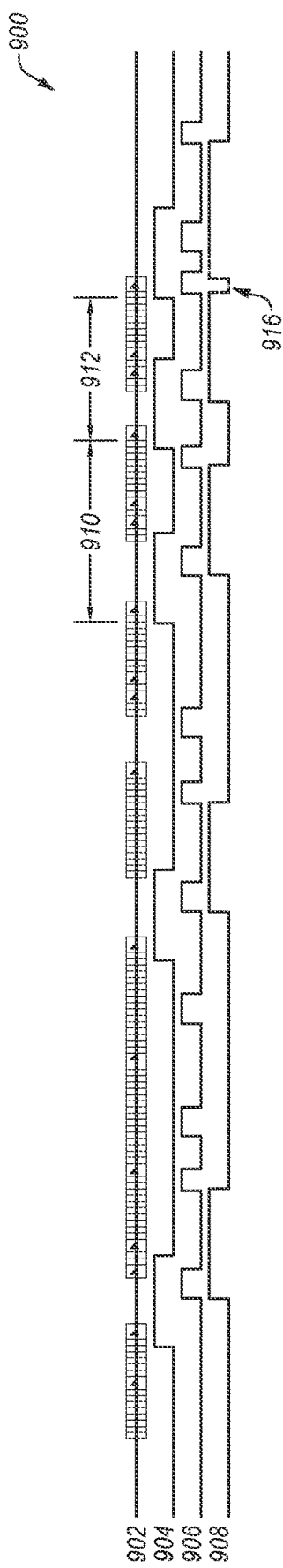

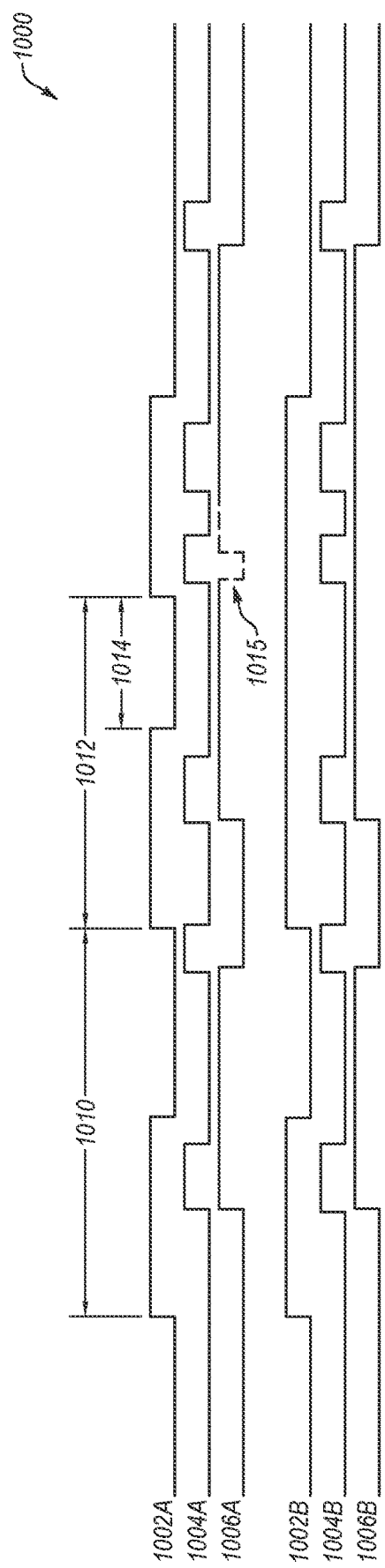

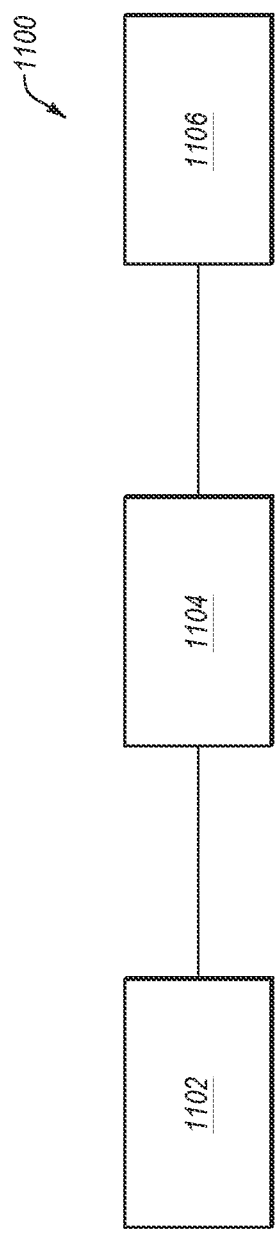

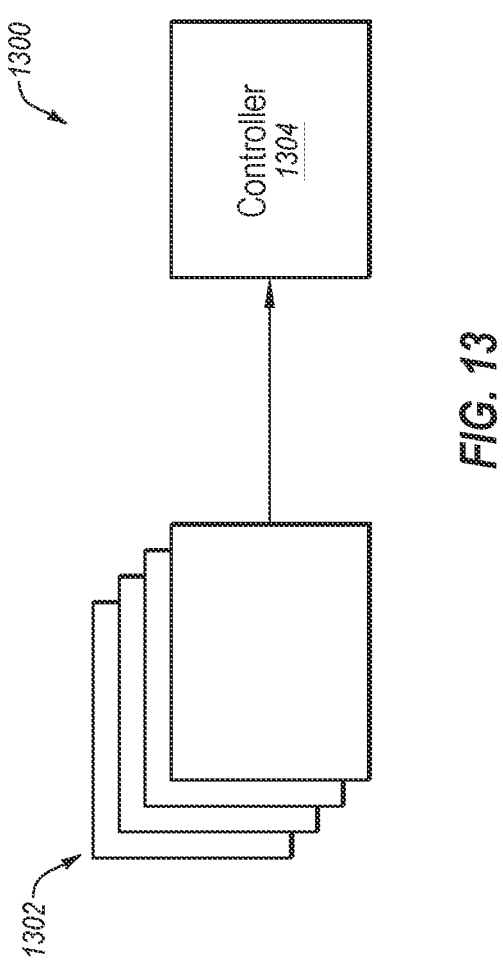

METHODS OF REDUCING CLOCK DOMAIN CROSSING TIMING VIOLATIONS, AND RELATED DEVICES AND SYSTEMS

TECHNICAL FIELD

Embodiments of the disclosure relate to reducing clock domain crossing timing violations. More specifically, various embodiments relate to resolving timing violations associated with semiconductor device clock domain crossings, and to related methods, devices, and systems.

BACKGROUND

Memory devices are typically provided as internal, semiconductor, integrated circuits in computers or other electronic systems. There are many different types of memory including, for example, random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM), and Flash memory.

Semiconductor memory devices typically include many memory cells that are capable of holding a charge that is representative of a bit of data. Typically, these memory cells are arranged in a memory array. Data may be written to or retrieved from a memory cell by selectively activating the memory cell. In some scenarios, clock domains of a semiconductor device may be synchronized and timing violations across clock domains (e.g., of one or more semiconductor devices) may be prevented and/or resolved via use of a synchronizer (e.g., a chain of flip-flops). A synchronizer may be used if a received clock signal is a continuous clock signal (i.e., the received clock signal is based on a continuous clock). However, if the received clock signal is a non-continuous clock signal (e.g., the clock signal is a number of pulses (e.g., a number of DQS click domain pulses)), a synchronizer may not be reliable for synchronizing clock domains.

BRIEF DESCRIPTION OF THE DRAWINGS

FIGS. 5-9 each depict a timing diagram illustrating various signals associated with a memory device.

FIG. 10 depicts a timing diagram illustrating various signals associated with a memory device, in accordance with various embodiments of the disclosure.

FIG. 11 depicts a portion of an example memory device, according to various embodiments of the disclosure.

FIG. 13 is a simplified block diagram of an example memory device, in accordance with various embodiments of the disclosure.

DETAILED DESCRIPTION

Figure 1:
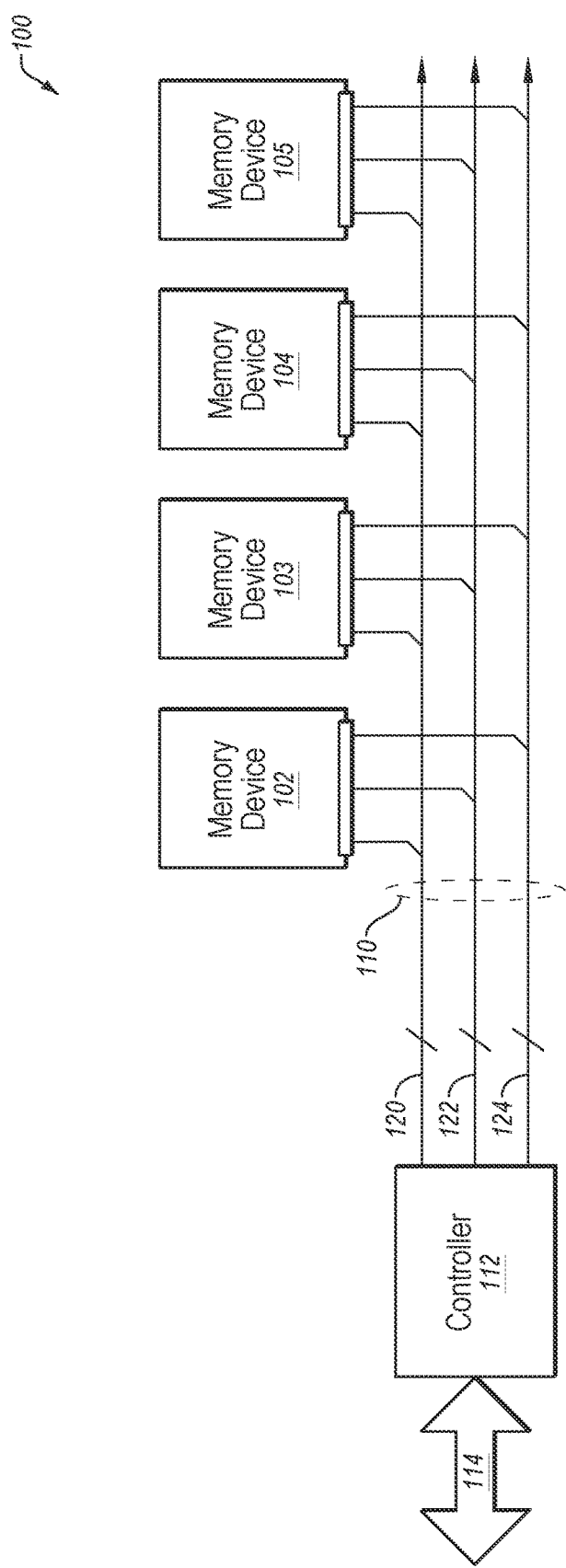
FIG. 1 is a block diagram of an example memory system including a number of memory devices, in accordance with various embodiments of the disclosure.

Semiconductor devices (e.g., semiconductor memory devices) may have and/or operate according to a number of clock domains, wherein at least one clock of a semiconductor device is asynchronous to, or has a variable phase relation with, another clock of the semiconductor device. For example, a command (e.g., a write command, a read command, a precharge command, without limitation) received at a semiconductor device may be "clocked" via an external clock and data received at the semiconductor device (e.g., data associated with a write command) may be "clocked" via a DQS clock, wherein the external clock and the DQS clock may be offset (i.e., in time). Further, in some examples, the semiconductor device may include one or more additional internal clocks for performing various operations. As will be appreciated by a person having ordinary skill in the art, a command (e.g., a write command generated according to an external clock domain) may be captured via a number of DQS clock domain pulses.

In some scenarios, clock domains of a semiconductor device may be synchronized and timing violations across clock domains (e.g., of one or more semiconductor devices) may be prevented and/or resolved via use of a synchronizer (e.g., a chain of flip-flops). A synchronizer may be used if a received clock signal is a continuous clock signal (i.e., the received clock signal is based on a continuous clock). However, if the received clock signal is a non-continuous clock signal (e.g., the clock signal is a number of pulses (e.g., a number of DQS clock domain pulses)), a synchronizer may not be reliable for synchronizing clock domains.

As will be appreciated by a person having ordinary skill in the art, a three-dimensional stacked (3DS) memory device (also commonly referred to as a "3DS memory system") includes a number of memory devices (i.e., a number of memory ranks) in a stack. 3DS memory devices may further include wire bonds that transmit various signals across the stack. A write enable (EnRx) signal is an enable signal that controls transmission of at least some write-related signals through the wire bonds. These write-related signals may be used to capture the write data on different memory ranks of the 3DS memory device.

As will also be appreciated by a person having ordinary skill in the art, a write enable signal may be generated by capturing a clock domain internal write signal with DQS domain clock pulses, which is not a continuous clock signal. The generated write enable signal, which is valid for a write period, is critical for capturing data on different memory ranks. This clock domain crossing may cause timing violations for different command-to-command spacing (e.g., write command-to-write command spacing).

Various embodiments described herein relate to resolving (i.e., without a synchronizer) clock domain crossing timing violations of semiconductor device. For example, according to some embodiments, an internal signal (e.g., a decoded internal write signal) may be asserted, at a semiconductor device, in response to receipt of a command (e.g., a write command received from another device (e.g., a controller, host, master device, without limitation)) at the semiconductor device. Further, the internal signal may be held HIGH (i.e., in an asserted state) for at least a predetermined time duration (i.e., after asserting the internal signal). More specifically, the internal signal may be held HIGH for a predetermined time duration that includes a first duration associated with completing a write operation (e.g., 8 tCK or 9 tCK) and an additional time duration (e.g., 4 tCK). As described more fully herein, according to various embodiments, a gapless internal signal may be generated (i.e., for certain command-to-command spacing) (i.e., asynchronous edges of the internal signal may be removed) to resolve a timing violation of a clock domain crossing. Further, in some examples, the internal signal may be conveyed to a logic circuit (e.g., a flip-flop circuit), which may generate an enable signal (e.g., a write enable signal) based on the internal signal (e.g., an internal write signal) and a clock signal (e.g., a number of DQS domain clock pulses).

Although various embodiments are described herein with reference to memory devices, the disclosure is not so limited, and the embodiments may be generally applicable to microelectronic devices that may or may not include semiconductor devices and/or memory devices. Embodiments of the disclosure will now explained with reference to the accompanying drawings.

FIG. 1 illustrates an example memory system 100, according to various embodiments of the disclosure. Memory system 100 includes a number of memory devices 102, 103, 104 and 105 coupled to a communication bus 110 (e.g., a system bus). Each memory device 102-105 may include one or more memory die, and collectively, memory devices 102-105 may be referred to as a memory module (e.g., a dual in-line memory module (DIMM)), a multi-chip package (MCP) or a package on package (POP). In at least some embodiments, one or more of memory devices 102-105 may be part of a 3DS memory device including a master die and a number of slave die.

Memory system 100 further includes a controller 112 coupled to each memory device 102-105 via communication bus 110. Controller 112, which may include a processor or any other suitable type of controller, may be configured to control and/or regulate various operations of memory system 100, as well as provide interactivity with another device or system coupled to memory system 100 via an interface 114.

Communication bus 110 may include one or more of an address bus 120, a data bus 122, and a control signal bus 124. In some embodiments, memory devices 102-105, communication bus 110, and controller 112 may be configured (e.g., physically arranged and mounted) on a printed circuit board (PCB). In various embodiments, memory system 100 may include a DIMM and one or more memory devices 102-105 may be a rank (or a number of ranks) of the DIMM.

Figure 2:
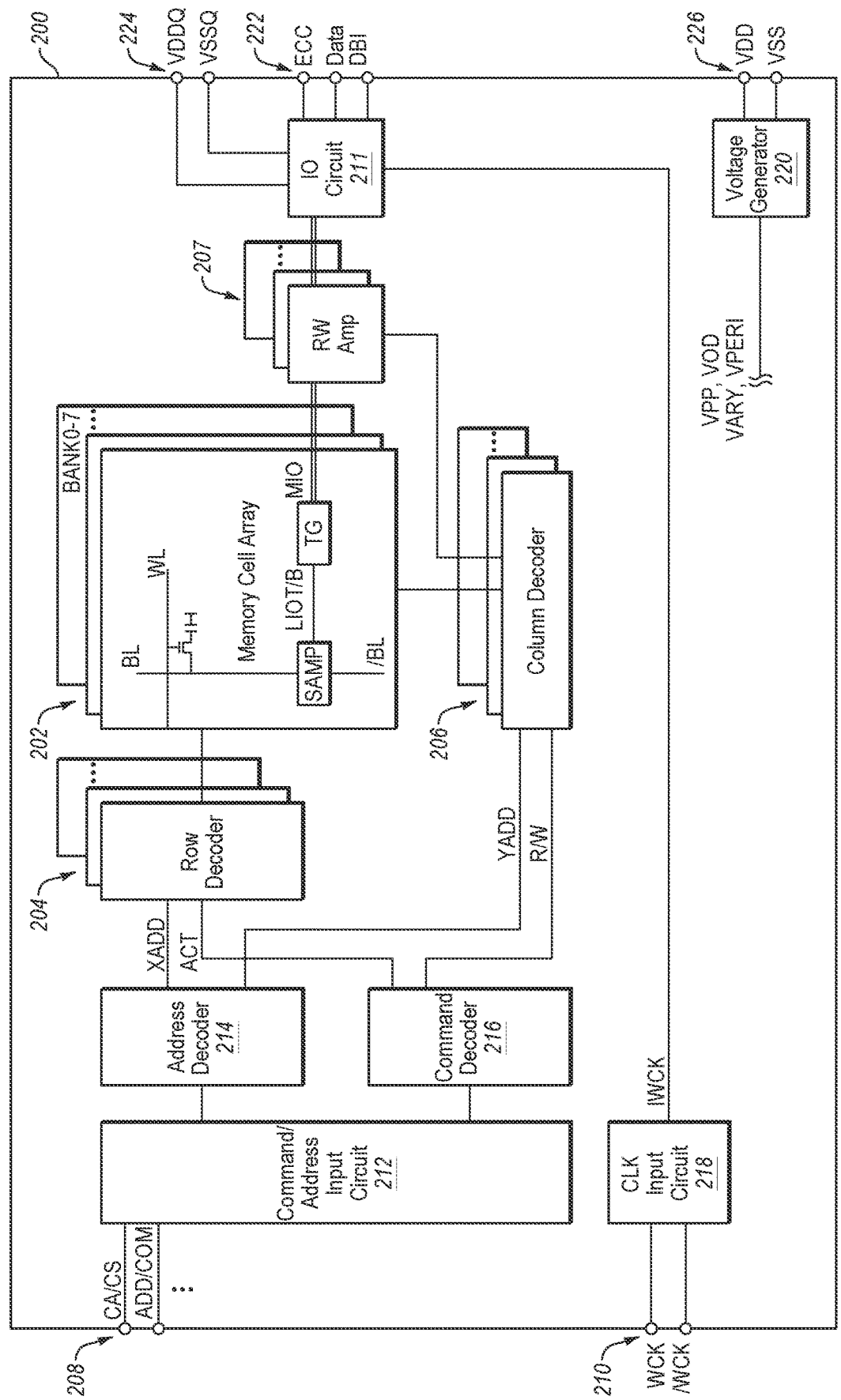
FIG. 2 is a block diagram of an example memory device, according to various embodiments of the disclosure.

FIG. 2 includes a block diagram of an example memory device 200, according to various embodiments of the disclosure. One or more of the memory devices shown in FIG. 1 may include memory device 200. Memory device 200 may include, for example, a DRAM (dynamic random access memory), a SRAM (static random access memory), a SDRAM (synchronous dynamic random access memory), a DDR SDRAM (double data rate DRAM, such as a DDR4 SDRAM and the like), or a SGRAM (synchronous graphics random access memory). Memory device 200, which may be integrated on a semiconductor chip, may include a memory array 202.

In the embodiment of FIG. 2, memory array 202 is shown as including eight memory banks BANK0-7. More or fewer banks may be included in memory array 202 of other embodiments. Each memory bank includes a number of access lines (word lines WL), a number of data lines (bit lines BL and /BL), and a number of memory cells MC arranged at intersections of the number of word lines WL and the number of bit lines BL and /BL. The selection of a word line WL may be performed by a row decoder 204 and the selection of the bit lines BL and /BL may be performed by a column decoder 206. In the embodiment of FIG. 2, row decoder 204 may include a respective row decoder for each memory bank BANK0-7, and column decoder 206 may include a respective column decoder for each memory bank BANK0-7.

Bit lines BL and /BL are coupled to a respective sense amplifier SAMP. Read data from bit line BL or /BL may be amplified by sense amplifier SAMP, and transferred over complementary local input/output lines (LIOT/B), a transfer gate TG, and complementary main input/output lines (MIOT/B). Conversely, write data may be transferred to sense amplifier SAMP over complementary main input/output lines MIOT/B, transfer gate TG, and complementary local input/output lines LIOT/B, and written in memory cell MC coupled to bit line BL or /BL.

Memory device 200 may be generally configured to be receive various inputs (e.g., from an external controller and/or another memory device) via various terminals, such as command and address terminals 208, clock terminals 210, and data and data mask terminals 222. Memory device 200 may include additional terminals such as power supply terminal 224 and power supply terminal 226, which may be coupled to a voltage generator 220.

During a contemplated operation, one or more command signals, received via command and address terminals 208, may be conveyed to a command decoder 216 via a command/address input circuit 212. Command decoder 216 may include a circuit configured to generate various internal commands via decoding one or more command signals COM. Examples of the internal commands include an active command ACT and a read/write signal R/W.

One or more address signals ADD, received via command and address terminals 208, may be conveyed to an address decoder 214 via command and address input circuit 212. Address decoder 214 may be configured to supply a row address XADD to row decoder 204 and a column address YADD to column decoder 206.

Active command ACT may include a pulse signal that is activated in response to a command signal COM indicating row access (e.g., an active command). In response to active signal ACT, row decoder 204 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 206 may be activated, and the bit line BL specified by column address YADD may be selected. As described more fully below, command decoder 216 or other circuitry of memory device 200 may include a decoding unit (e.g., decoding unit 1102 of FIG. 11) (i.e., for decoding received commands) and/or signal modification unit (e.g., modification unit 1104 of FIG. 11), which may be configured to hold an internal signal (e.g., an internal write signal) HIGH (i.e., in an asserted state) for at least a predetermined time duration to prevent a clock domain crossing timing violation, as described more fully below.

In response to active command ACT, a read signal, a row address XADD, and a column address YADD, data may be read from memory cell MC specified by row address XADD and column address YADD. The read data may be output via a sense amplifier SAMP, transfer gate TG, read/write amplifiers 207, an input/output circuit 211, and data terminal 222. Further, in response to active command ACT, a write signal, a row address XADD, and a column address YADD, write data may be supplied to memory array 202 via data terminal 222, input/output circuit 211, read/write amplifiers 207, transfer gate TG, and sense amplifier SAMP. The write data may be written to memory cell MC specified by row address XADD and column address YADD.

Clock signals CK and /CK may be received via clock terminals 210. A clock input circuit 218 may generate internal clock signals IWCK based on clock signals WCK and /WCK. Internal clock signals IWCK may be conveyed to various components of memory device 200. For example, internal clock signals IWCK may be conveyed to input/output circuit 211 (e.g., for controlling the operation timing of input/output circuit 211).

As described more fully below, according to some embodiments, memory device 200 may be part of a three-dimensional stacked (3DS) memory device. In at least these embodiments, memory device 200 may include 3DS control logic (e.g., coupled to command decoder and/or other circuitry of memory device 200).

Figure 3:
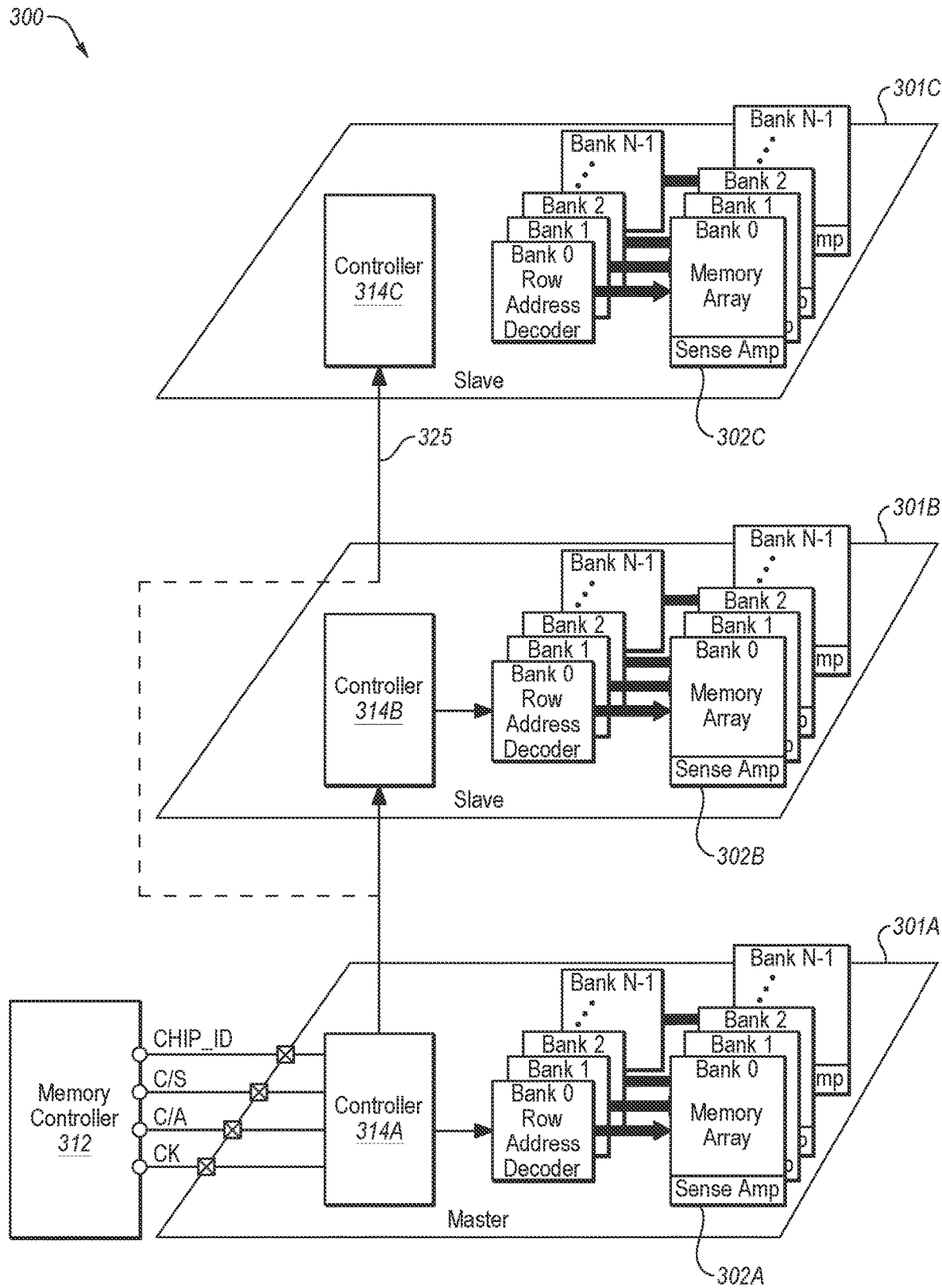
FIG. 3 is a block diagram illustrating an example three-dimensional stacked (3DS) memory device, according to various embodiments of the disclosure.

FIG. 3 is a block diagram illustrating a 3DS memory device 300, in accordance with various embodiments of the disclosure. 3DS memory device 300 comprises a number (e.g., 4, 8, 12, 16) of stacked memory devices (e.g., memory devices 301A, 301B, and 301C, etc.) including through-silicon vias (TSVs) and interconnected through, for example, conductive pillars bonded to aligned terminal pads of adjacent memory devices, the assembly using direct chip attach (DCA) to a host device or to higher level packaging. Each memory device of 3DS memory device 300 may function as a different logical rank. One or more of memory devices 301 of FIG. 3 may include memory device 200 of FIG. 2.

In 3DS memory device 300, each of memory devices 301A, 301B, and 301C may be configured to operate as a master memory device (e.g., memory device 301A) or as slave memory devices (e.g., memory devices 301B and 301C). In some embodiments, only master memory device 301A interfaces with the external memory controller (e.g., memory controller 312) or host controller; the slave devices are controlled by memory controller 312 through master device 301A. That is, memory controller instructions to slave memory devices 301B and 301C pass through and are "filtered" by master memory device 301A (e.g., memory devices of a slave type receive commands or control information from a memory devices of a master type via a path 325). In some embodiments, both the master device (e.g., master device 301A) and the slave devices (e.g., slave devices 301B and 301C) have similar hardware components except that the slave devices may be configured to disable "master" functionality (e.g., via fuse configuration, packing bonding, or by programming via for example mode registers). In other embodiments, only a master device includes hardware for "master functionality" (e.g., hardware to interface memory controller 312).

Each of the master and slave devices in 3DS memory device 300 includes a memory array, for example, memory array 302A in master device 301A, and memory arrays 302B and 302C in memory devices 301A, and 301C, respectively. Further, as will be appreciated by a person having ordinary skill in the art, each memory device 301A, 301B, and 301C may respectively include a controller 314A, 313B and 314C, which may include, for example, 3DS control logic and possibly other circuitry. As will also be appreciated, 3DS control logic may include a flip-flop circuit (e.g., a flip-flop circuit 400 of FIG. 4) used to capture a clock domain internal signal (e.g., internal write signal) with a clock signal (e.g., a number of DQS clock domain pulses).

As noted above, 3DS memory devices may further include wire bonds or TSVs that transmit various signals across the stack. A write enable (EnRx) signal is an enable signal that controls transmission of at least some write-related signals through the wire bonds or TSVs. These write-related signals may be used to capture the write data on different memory ranks of the 3DS memory device.

Figure 4:
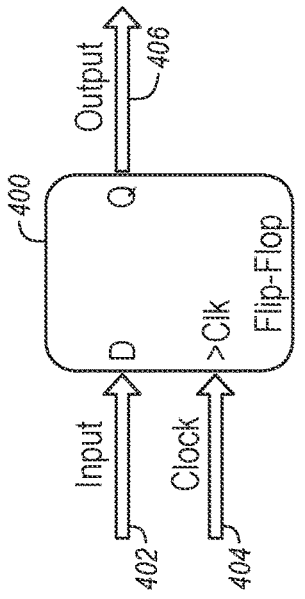
FIG. 4 depicts an example flip-flop circuit.

FIG. 4 depicts flip-flop circuit 400 configured to receive an input signal 402 and a clock signal 404, and output an output signal 406. As an example, flip-flop circuit 400 may include a clocked D flip-flop. Further, for example, a memory device (e.g., memory device 200 of FIG. 2 and/or memory device 301 of FIG. 3) may include flip-flop circuit 400, and input signal 402 may be an internal signal (e.g., a signal internal to a memory device and asserted in response to receipt of a command signal), clock signal 404 may be a clock signal (e.g., a number of DQS domain clock pulses), and output signal 406 may be a command enable signal (e.g., a write enable signal). For example, controller 314 (see FIG. 3) of memory device 301 may include flip-flop circuit 400. Yet more specifically, 3DS control logic of controller 314 may include flip-flop circuit 400.

As will be understood by a person having ordinary skill, flip-flop circuits have two stable states and may be used to store state information. A D flip-flop is an edge triggered device that transfers input data (e.g., input signal 402) to an output (e.g., output signal 406) on rising or falling edges of a clock (e.g., clock signal 404). Flip-flop circuits are known in the art, and thus, the operation of flip-flop 400 will not be described in more detail.

In some examples, input signal 402 may be asserted in response to a command signal received at a memory device (e.g., from a host and/or a controller or a master device in a 3DS memory device). For example, the command signal may be decoded to generate input signal 402. In some examples, input signal 402 may be a write flag (e.g., associated with a clock domain) captured via signal 404 (e.g., a number DQS domain clock pulses), and output signal 406 may be a write enable signal (e.g., to enable a memory cell array of the memory device to receive data).

Figure 5:
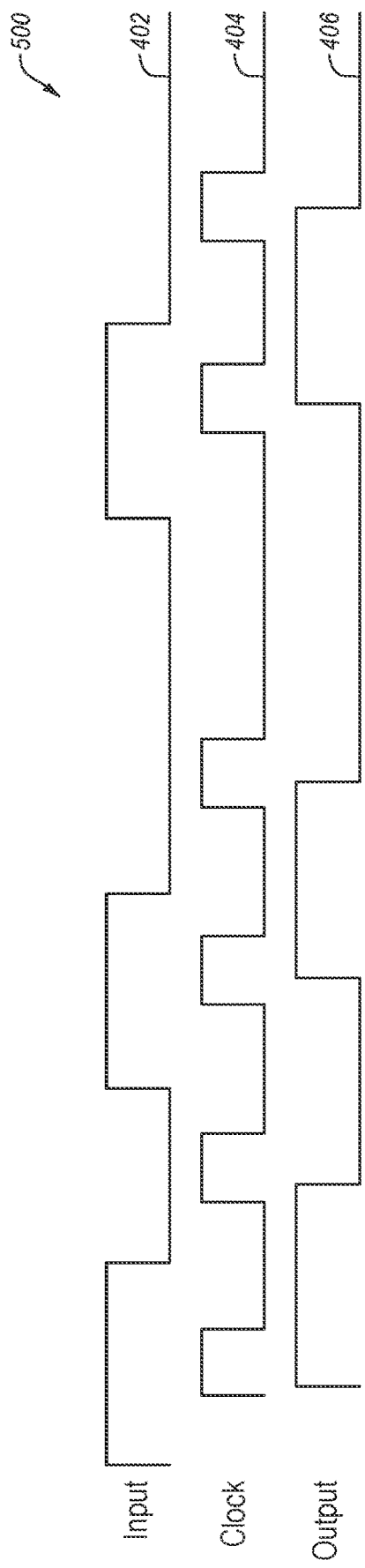

FIG. 5 depicts a timing diagram 500 including input signal 402, clock signal 404, and output signal 406. As illustrated in timing diagram 500, clock signal 404 is not a continuous clock, but rather clock signal 404 is a set of pulses. Therefore, in this example, a synchronizer may not be used to synchronize input signal 402 and clock signal 404 (i.e., because a synchronizer may depend on a continuous clock to capture data).

With continued reference to FIG. 5, clock signal 404 may include a number of pulses (e.g., DQS domain clock pulses, which are used to identify a beginning and an end of an operation (e.g., a write operation)). Further, in these examples, input signal (also referred to herein as an "internal signal") 402 may be generated at a memory device in response to receipt of a command (e.g., a write command) and output signal 406 may include an enable signal (e.g., a write enable (EnRx) signal).

As noted above, clock signal 404 may be based on a beginning and an ending of an operation (e.g., a write operation). More specifically, for example, clock signal 404 may be a clock signal generated via a number of DWload signals, wherein the DWload signals (e.g., on the DQS clock domain) may identify a start and an end of an operation. In other words, for example, the DWload signals may mark the first bit and the last bit of data (e.g., of a data burst) of a write operation. Yet more specifically, for example, a first DWload signal (e.g., a DWloadEarly signal) may identify a start of a write operation (i.e., the first bit of data of the write operation) and a second DWload signal (e.g., a DWload15 signal or a DWloadCRC17 signal (i.e., in an example including cyclic redundancy check (CRC))) may identify an end of a write operation (i.e., the last bit of data of the write operation).

Figure 6:
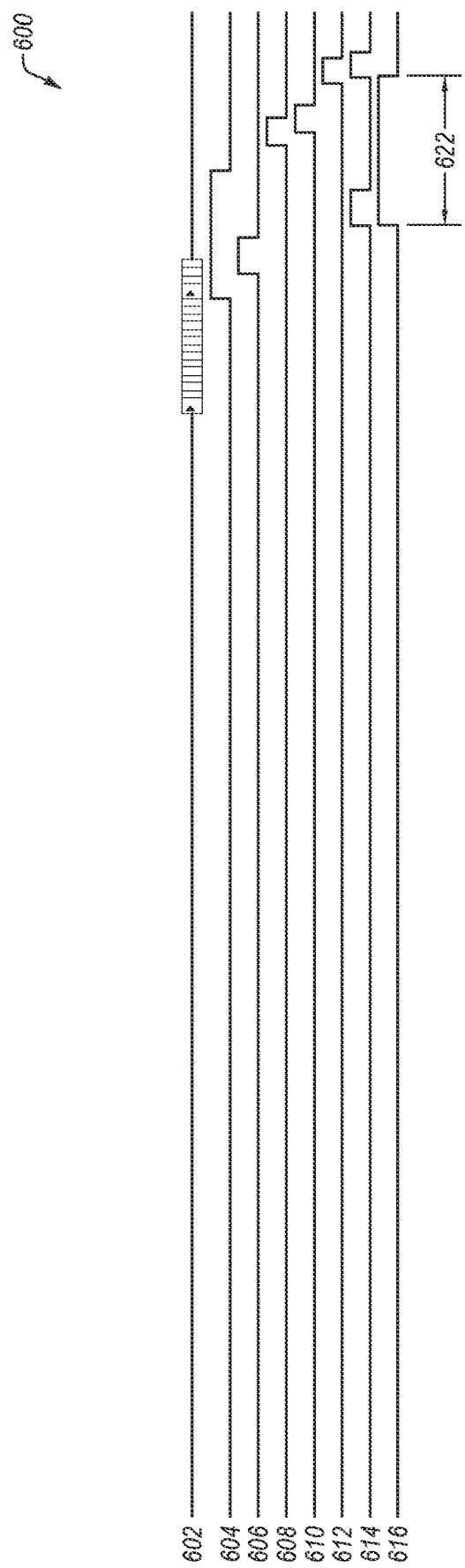

With reference to a timing diagram 600 illustrated in FIG. 6, a signal 602 represents a data signal (e.g., received at a memory device) and a signal 604 represents an internal signal (e.g., input signal 402 of FIG. 4) asserted in response to a received write command. Further, a signal 606 represents a first DWload signal (e.g., a DWloadEarly signal (i.e., identifying a start of a write operation)), a signal 608 represents a second DWload signal (e.g., a DWload15 signal identifies an end of a write operation (i.e., without CRC)), a signal 610 represents a third DWload signal (e.g., a DWloadCRC17 signal identifies an end of a write operation (i.e., with CRC)). Moreover, a signal 612 includes a pulse generated in response to a falling edge of either signal 608 (i.e., the second DWload signal) or signal 610 (i.e., the third DWload signal). Further, signal 614 represents a clock signal (e.g., clock signal 404 of FIG. 4), and signal 616 represents a write enable signal (e.g., signal 406 of FIG. 4).

As will be appreciated by a person having ordinary skill in the art, and as shown in FIG. 6, to ensure that all write bits are captured, a falling edge of signal 616 is captured based on a falling edge of either signal 608 (i.e., in an example without CRC) or signal 610 (i.e., in an example including CRC). Further, it is noted that signal 616 (e.g., a write enable signal) is asserted for a sufficient duration 622 (e.g., 8 tCK for a write without CRC or 9 tCK for a write with CRC) such that all bits of a write are captured.

As will be appreciated by a person having ordinary skill in the art, according to various specifications (e.g., DRAM specifications), a column-to-column (short) delay (or command-to-command (short) delay) "tCCD_s" is a required minimum timing delay between commands for different memory bank groups. As will also be appreciated, a timing violation may occur when commands (e.g., write commands) are not sufficiently spaced in time. In other words, if the data and the clock received at a circuit (e.g., a flip-flop, such as circuit 200 of FIG. 2) are too close in time to one another, the setup/hold time for the circuit may be too short and a timing violation may occur. For example, a timing violation may occur for different write-to-write command spacing (e.g., tCCD_s+n*tCK, where n is a small number (e.g., 10≤n≤13)). As a more specific example, in an embodiment including CRC (i.e., including two extra bits), a timing violation may occur if write commands are separated by, for example, 13 tCK or less. As another specific example, in an embodiment without CRC, a timing violation may occur if write commands are separated by, for example, 12 tCK or less.

Figure 7:
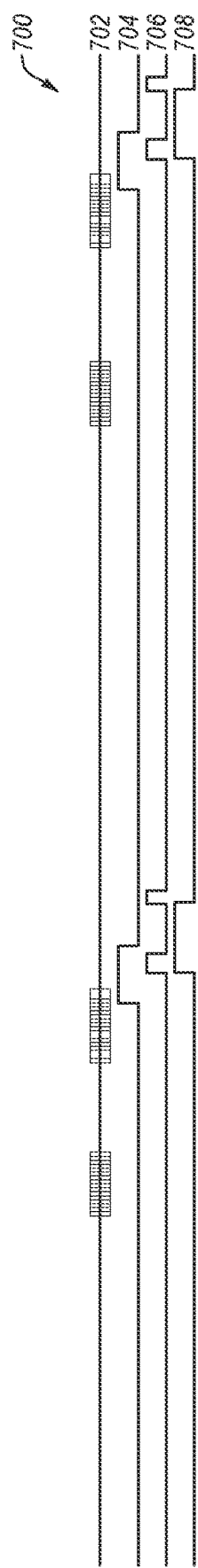
Figure 8:
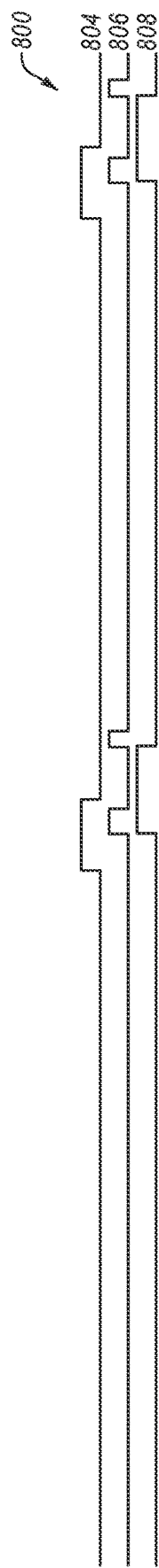

FIGS. 7 and 8 depict additional timing diagrams 700 and 800, respectively. With reference to timing diagram 700 of FIG. 7, a signal 702 represents a data signal (e.g., received at a memory device), a signal 704 represents an internal write signal (e.g., input signal 402 of FIG. 4) asserted in response to a received write command, a signal 706 represents a clock signal (e.g., clock signal 404 of FIG. 4), and a signal 708 represents a write enable signal (e.g., output signal 406 of FIG. 4). Further, with reference to timing diagram 800 of FIG. 8, a signal 804 represents an internal write signal (e.g., input signal 402 of FIG. 2) asserted in response to a received write command, a signal 806 represents a clock signal (e.g., clock signal 404 of FIG. 4), and a signal 808 represents a write enable signal (e.g., output signal 406 of FIG. 4).

In the examples shown in FIGS. 7 and 8, the pulses of the internal write signals (i.e., signals 704 and 804) are sufficiently spaced such that a timing violation does not occur. More specifically, in the example of FIG. 7, internal write signals (i.e., represented by signal 704) are separated by more than 100 tCK, and thus a timing violation does not occur. Further, in the example of FIG. 8, internal write signals (i.e., represented by signal 804) are separated by more than 60 tCK, and thus a timing violation does not occur.

FIG. 9 depicts another timing diagram 900 wherein a signal 902 represents a data signal (e.g., received at a memory device), a signal 904 represents an internal write signal (e.g., input signal 402 of FIG. 4) asserted in response to a received write command, a signal 906 represents a clock signal (e.g., clock signal 404 of FIG. 4), and a signal 908 represents a write enable signal (e.g., output signal 406 of FIG. 4). In this example, a duration 910 between successive writes (i.e., between rising edges of signal 904) is 14 tCK, which may not cause a timing violation. However, a duration 912 between successive writes (i.e., between rising edges of signal 904) is 12 tCK, and signal 908 transitions LOW, thus causing a timing violation, as indicated by reference numeral 916.

As will be appreciated by a person having ordinary skill, write commands that are tCCD_s+n apart have a low pulse in an internal write signal (e.g., signal 402 of FIG. 4) for n*tCK, and this low pulse may cause a timing violation for a certain range of write-to-write command spacing. Further, as will also be appreciated by a person having ordinary skill, delaying a clock signal that captures an end of a write operation may cause other timing violations (e.g., for a different command-to-command spacing). Moreover, increasing the speed of a clock signal may cause a write enable signal (e.g., signal 406 of FIG. 4) to be invalid for at least a portion of a write period.

According to various embodiments of the disclosure, to avoid at least some timing violations, an internal write signal (e.g., asserted in response to receipt of a write command) may be prevented from transitioning LOW between write commands that are insufficiently spaced in time. In other words, an internal write signal provided to a circuit (e.g., flip-flop 400 of FIG. 4) may be held HIGH between write commands that are insufficiently spaced in time. Stated yet another way, an internal write signal may be modified (also referred to herein as "altered") to prevent any low pulses for a certain range of command spacing (e.g., write-to-write spacing) to ensure that at least some timing violations are avoided.

More specifically, according to various embodiments, in examples not including CRC and wherein consecutive write commands are separated by, for example, 12 tCK or less, the internal write signal may be modified such that the internal write signal provided to a flip-flop (e.g., flip-flop 400 of FIG. 4) may not transition LOW between the consecutive write commands (i.e., the internal write signal is gapless). More specifically, the internal write signal may be held HIGH for a predetermined time duration (e.g., 12 tCK) that includes a first time duration associated with a write operation (e.g., 8 tCK) (i.e., a time required to complete the write operation) and an additional time duration (e.g., 4 tCK). Further, in examples not including CRC and wherein consecutive write commands are separated by more than, for example, 12 tCK, the internal signal may be modified such that the internal signal provided to a flip-flop (e.g., flip-flop 400 of FIG. 4) may transition LOW (i.e., between the consecutive write commands) after a predetermined time duration (e.g., 12 tCK) (i.e., including a first time duration associated with a write operation (e.g., 8 tCK) (i.e., a time required to complete the write operation) and an additional time duration (e.g., 4 tCK)). As a more specific example (i.e., not including CRC), if two consecutive write commands are separated by 20 tCK, the internal write signal may be HIGH for a first time duration (e.g., 12 tCK) (i.e., for the first command), LOW for second time duration (e.g., 8 tCK), then HIGH for a third time duration (e.g., 12 tCK) (i.e., for the second command). As another example (i.e., not including CRC), if two consecutive write commands are separated by 12 tCK or less, the internal write signal may be HIGH for 24 tCK (i.e., 12 tCK for the first command and 12 tCK for the second command). In this example, the internal write signal in gapless between write commands.

In other examples including CRC and wherein consecutive write commands are separated by, for example, 13 tCK or less, the internal signal may be modified such that the internal signal provided to a flip-flop (e.g., flip-flop 400 of FIG. 4) may not transition LOW between the consecutive write commands. Further, in examples including CRC and wherein consecutive write commands are separated by more than, for example, 13 tCK, the internal signal may be modified such that the internal signal provided to a flip-flop (e.g., flip-flop 400 of FIG. 4) may transition LOW (i.e., between the consecutive write commands) after a predetermined time duration, which may be, for example, 13 tCK (i.e., including a first time duration associated with a write operation (e.g., 9 tCK) (i.e., a time required to complete the write operation) and an additional time duration (e.g., 4 tCK)).

FIG. 10 depicts another timing diagram 1000 wherein a signal 1002A represents an internal write signal (e.g., input signal 402 of FIG. 4), a signal 1004A represents a clock signal (e.g., clock signal 404 of FIG. 4), and a signal 1006A represents a write enable signal (e.g., output signal 406 of FIG. 4). In this example, a time duration 1010 between successive writes is 14 tCK, which may not cause a timing violation. However, another time duration 1012 between successive writes (e.g., between rising edges of signal 1002A) is 12 tCK, and signal 1006A transitions LOW, thus causing a timing violation, as indicated by reference numeral 1015.

As noted above, a timing violation may be avoided via preventing the internal signal from transitioning from an asserted state (e.g., HIGH) to a de-asserted state (e.g., LOW) for at least a predetermined time duration (e.g., 12 tCK or 13 tCK, which includes a first time duration associated with a write operation (e.g., 8 tCK or 9 tCK) and an additional time duration (e.g., 4 tCK)) after being asserted (i.e., in response to a command). For example, with continued reference to FIG. 10, a signal 1002B represents an internal write signal (e.g., input signal 202 of FIG. 2), a signal 1004B represents a clock signal (e.g., clock signal 404 of FIG. 4), and a signal 1006B represents a write enable signal (e.g., output signal 406 of FIG. 4). In this example, in contrast to signal 1002A that includes a low pulse during time duration 1014, signal 1002B does not include a low pulse during time duration 1014. In other words, a low pulse of signal 1002B is "plugged" (i.e., signal 1002B is held HIGH) during time duration 1014. Therefore, asynchronous edges of internal write signal 1002B may be removed and a timing violation may be avoided.

By "plugging" a low pulse of an internal write signal for a certain range of write-to-write command spacing, the internal write signal may be gapless for at least some write-to-write spacing examples (e.g., for write-to-write spacing of 12 tCK or less in embodiments not including CRC). In other words, modifying (also referred to herein as "altering") the internal write signal such that the internal write signal remains in an asserted state for at least a predetermined time duration (e.g., 12 tCK or 13 tCK) causes the enable signal (e.g., write enable EnRx) to remain HIGH between the pulses of the internal write signal. In other examples, the internal write signal may transition LOW between pulses (i.e., after the predetermined time duration).

As will be understood by a person having ordinary skill in the art, according to various specifications (e.g., DRAM specifications), some commands, such as read commands, require a write enable (EnRx) signal to be LOW, and therefore these commands cannot be issued between successive write commands while the write enable signal is HIGH. Accordingly, modifying the internal write signal (e.g., signal 402 of FIG. 4) may not cause a conflict or any undesirable issues with the functionality of a memory device. In other words, as defined in various specifications (e.g., DRAM specifications), commands cannot be issued between successive writes while the write enable signal is HIGH, and therefore, holding the internal signal HIGH for at least a predetermined time duration (e.g., 12 tCK or 13 tCK) after a write command (and while write enable is HIGH) does not conflict with at least some DRAM specifications.

FIG. 11 is a block diagram of a portion of a memory device 1100, according to one or more embodiments of the disclosure. Memory device 1100 includes a decoding unit 1102, a modification unit 1104, and circuitry 1106, which may comprise logic circuitry and/or other circuitry. For example, decoding unit 1102, which may be part of or include a command decoder (e.g., command decoder 216 of FIG. 2) and/or other decoders, may decode a received command (e.g., from a host/controller and/or a master device of a stack) to assert an internal write signal (e.g., signal 402 of FIG. 4). Further, for example, the generated internal write signal, which may include a pulse (i.e., with a rising edge at a first time and in response to the received command), may be sent to modification unit 1104.

Modification unit 1104, which may be part of or include a command decoder (e.g., command decoder 116 of FIG. 2) or other circuitry of memory device 200 of FIG. 2, may be configured to receive the internal write signal and modify the internal write signal such that internal write signal is held HIGH (i.e., in an asserted state) for at least a predetermined time duration (i.e., starting at the first time). For example, in embodiments including CRC, the predetermined time duration may be, for example, 13 tCK, and in embodiments not including CRC, the predetermined time duration may be, for example, 12 tCK.

As will be appreciated, modification of the internal write signal (i.e., to hold the internal write signal HIGH) may be carried out via one or more known circuits. For example, the internal write signal may be modified (e.g., held HIGH) via a counter and a flip-flop (or latch), wherein upon arrival of a command, the flip-flop is set, and after the time duration (i.e., when the counter has a count equal to, for example, 12 tCK or 13 tCK), the flip-flop is reset. As another example, the internal write signal may be modified (e.g., held HIGH)

via shifting the internal write signal through M flip-flops, wherein each flip-flop is sampled by subsequent clock edges. In this example, a cascaded set of commands (i.e., generated via the M flip-flops) may be ORed together to generate an output that goes HIGH upon the first command and goes LOW after the Mth command (e.g., after M cycles). These non-limiting examples are provided for explanation purposes only, and the disclosure is not limited to any specific circuits and/or methods for holding a signal in a HIGH (asserted) state. As will be appreciated, various other methods and/or circuits may be used to hold a signal in a state (e.g., HIGH state).

Moreover, the modified internal write signal may be conveyed to circuitry 1106, which may include logic circuitry, such as a flip-flop (e.g., flip-flop 400 of FIG. 4). Further, the flip-flop of circuitry 1106 may generate a write enable signal (e.g., signal 406 of FIG. 4) via capturing the internal write signal (e.g., signal 402 of FIG. 4) with a clock signal (e.g., DQS clock domain clock pulses) (e.g., signal 404 of FIG. 4). For example, circuitry 1106, which may include 3DS control logic, may be part of controller 314 (see FIG. 3).

Figure 12A:
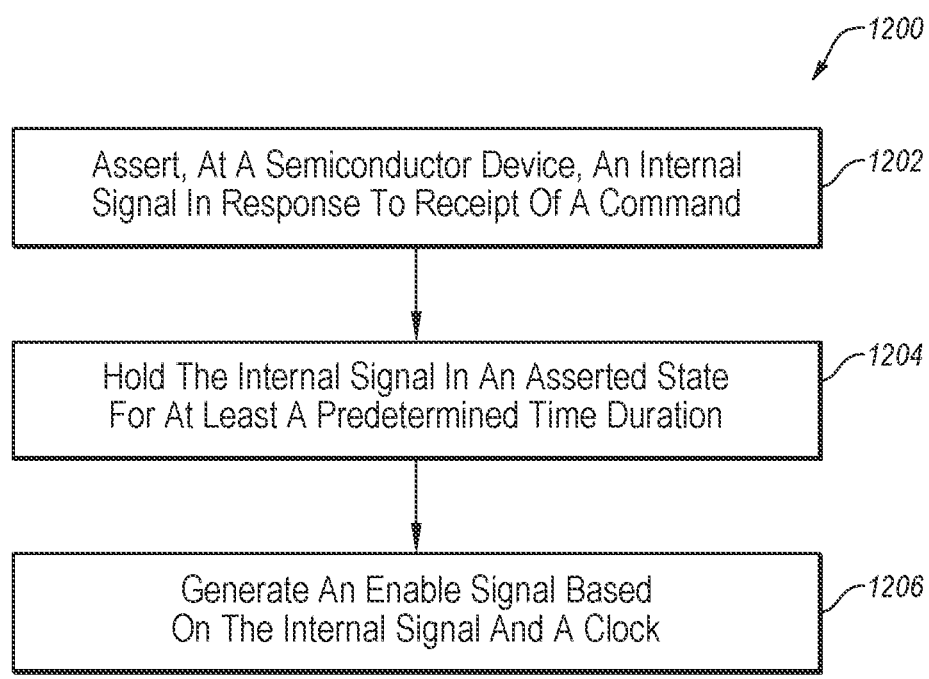
FIG. 12A is a flowchart of an example method of operating a memory device, in accordance with various embodiments of the disclosure.

FIG. 12A is a flowchart of an example method 1200 of operating a memory device, in accordance with various embodiments of the disclosure. Method 1200 may be arranged in accordance with at least one embodiment described in the disclosure. Method 1200 may be performed, in some embodiments, by a device or system, such as memory system 100 of FIG. 1, memory device 200 of FIG. 2, memory device 300 of FIG. 3, flip-flop circuit 400 of FIG. 4, memory device 1100 of FIG. 11, memory device 1300 of FIG. 14, and/or system 1400 of FIG. 14, or another device or system. Although illustrated as discrete blocks, various blocks may be divided into additional blocks, combined into fewer blocks, or eliminated, depending on the desired implementation.

Method 1200 may begin at block 1202, wherein an internal signal may be asserted at a semiconductor device in response to receipt of a command, and method 1200 may proceed to block 1204. For example, the command may be a write command and the internal signal may be an internal write signal. Further, for example, the semiconductor device may be a slave device of a three-dimensional stacked (3DS) memory device and the command may be received from a master device of the 3DS memory device.

At block 1204, the internal signal may be modified such that the internal signal remains in an asserted state for at least a predetermined time duration, and method 1200 may proceed to block 1206. For example, the internal signal, which may include internal write signal, may be held in a HIGH state (an asserted state) for either 12 tCK (i.e., in embodiments not including CRC) or 13 tCK (i.e., in embodiments including CRC). It is noted that the predetermined time duration (e.g., 12 tCK or 13 tCK) includes a first time duration associated with a write operation (e.g., 8 tCK or 9 tCK) and an additional time duration (e.g., 4 tCK). For example, the internal signal may be modified via one or more logic circuits (e.g., counter, flip-flops, without limitation) (e.g., of modification unit 1104 of FIG. 11).

At block 1206, an enable signal may be generated based on the internal signal and a clock signal. For example, the enable signal may be generated via a flip-flop (e.g., flip-flop 400 of FIG. 4) in response to receipt of the internal signal and the clock signal. For example, the enable signal may be a write enable signal and the clock signal may include a number of DQS clock domain pulses.

Modifications, additions, or omissions may be made to method 1200 without departing from the scope of the disclosure. For example, the operations of method 1200 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, a method may include one or more acts wherein the command may be transmitted from another device (e.g., a master semiconductor device of a three-dimensional stacked (3DS) device) and received at the semiconductor device (e.g., a slave semiconductor device of a three-dimensional stacked (3DS) device).

Figure 12B:
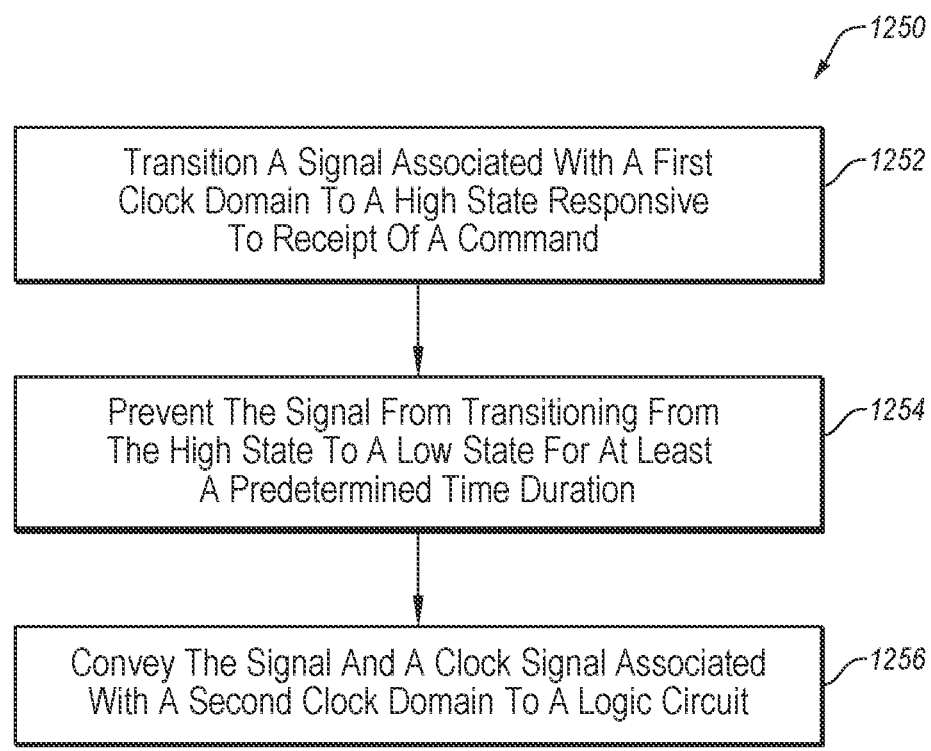
FIG. 12B is a flowchart of another example method of operating a memory device, in accordance with various embodiments of the disclosure.

FIG. 12B is a flowchart of an example method 1250 of operating a memory device, in accordance with various embodiments of the disclosure. Method 1250 may be arranged in accordance with at least one embodiment described in the disclosure. Method 1250 may be performed, in some embodiments, by a device or system, such as memory system 100 of FIG. 1, memory device 200 of FIG. 2, memory device 300 of FIG. 3, flip-flop circuit 400 of FIG. 4, memory device 1100 of FIG. 11, memory device 1300 of FIG. 14, and/or system 1400 of FIG. 14, or another device or system. Although illustrated as discrete blocks, various blocks may be divided into additional blocks, combined into fewer blocks, or eliminated, depending on the desired implementation.

Method 1250 may begin at block 1252, wherein a signal associated with a first clock domain may transition to a HIGH state responsive to a received command, and method 1250 may proceed to block 1254. For example, the signal, which may be associated with an external clock domain, may transition to a HIGH state responsive to a received write command.

At block 1254, the signal may be prevented from transitioning from the HIGH state to a LOW state for at least a predetermined time duration, and method 1250 may proceed to block 1256. For example, the signal may be prevented from transitioning to the LOW state for either 12 tCK (i.e., in embodiments not including CRC) or 13 tCK (i.e., in embodiments including CRC). It is noted that the predetermined time duration (e.g., 12 tCK or 13 tCK) includes a first time duration associated with a write operation (e.g., 8 tCK or 9 tCK) and an additional time duration (e.g., 4 tCK). For example, the internal signal may be prevented from transitioning to the LOW state via one or more logic circuits (e.g., a counter and/or flip-flops, without limitation).

At block 1256, a clock signal associated with a second clock domain and the signal may be conveyed to a logic circuit. For example, the clock signal, which may be associated with a DQS clock domain, and the internal signal, which may be associated with an external clock domain, may be conveyed to a flip-flop circuit. For example, the clock signal may include a number of DQS clock domain pulses.

Modifications, additions, or omissions may be made to method 1250 without departing from the scope of the disclosure. For example, the operations of method 1250 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, a method may include one or more acts wherein the signal is received at a first input of the logic circuit, the clock signal is received at a second input of the logic circuit, and an output signal (e.g., an enable signal) is generated via the logic circuit. Further, for example, a method may include one or more acts wherein the signal is captured with the clock signal (e.g., via the logic circuit). Moreover, for example, a method may include one or more acts wherein a write enable signal may be generated (e.g., via the logic circuit) based on the write signal and the clock signal, which may include a number of DQS domain clock pulses.

As described herein, according to various embodiments, timing violations of clock domain crossing with a non-conventional clock signal may be avoided via altering an internal signal (e.g., a clock domain write signal) that is captured via a DQS domain clock signal (i.e., without altering the DQS domain clock signal). Further, according to various embodiments, via leveraging DRAM specifications, the internal signal may be modified such that asynchronous edges of the internal signal may be removed, which may prevent timing violations across all speed grades for a clock domain crossing.

A memory device is also disclosed. According to various embodiments, the memory device may include one or more memory cell arrays, such as memory array 202 (see FIG. 2). The one or more memory cell arrays may include a number of memory cells.

FIG. 13 is a simplified block diagram of a memory device 1300 implemented according to one or more embodiments described herein. Memory device 1300, which may include, for example, a semiconductor device, includes a memory array 1302 and a controller 1304.

Memory array 1302, which may include a number of memory banks, may include a number of memory cells. Controller 1304 may be operatively coupled with memory array 1302 so as to read, write, or refresh any or all memory cells within memory array 1302. For example, memory device 1300, which may be one of a number of memory devices of a three-dimensional stacked (3DS) memory device, may be configured to carry out various embodiments disclosed herein.

A system is also disclosed. According to various embodiments, the system may include a memory device including a number of memory banks, each memory bank having an array of memory cells. Each memory cell may include an access transistor and a storage element operably coupled with the access transistor.

Figure 14:
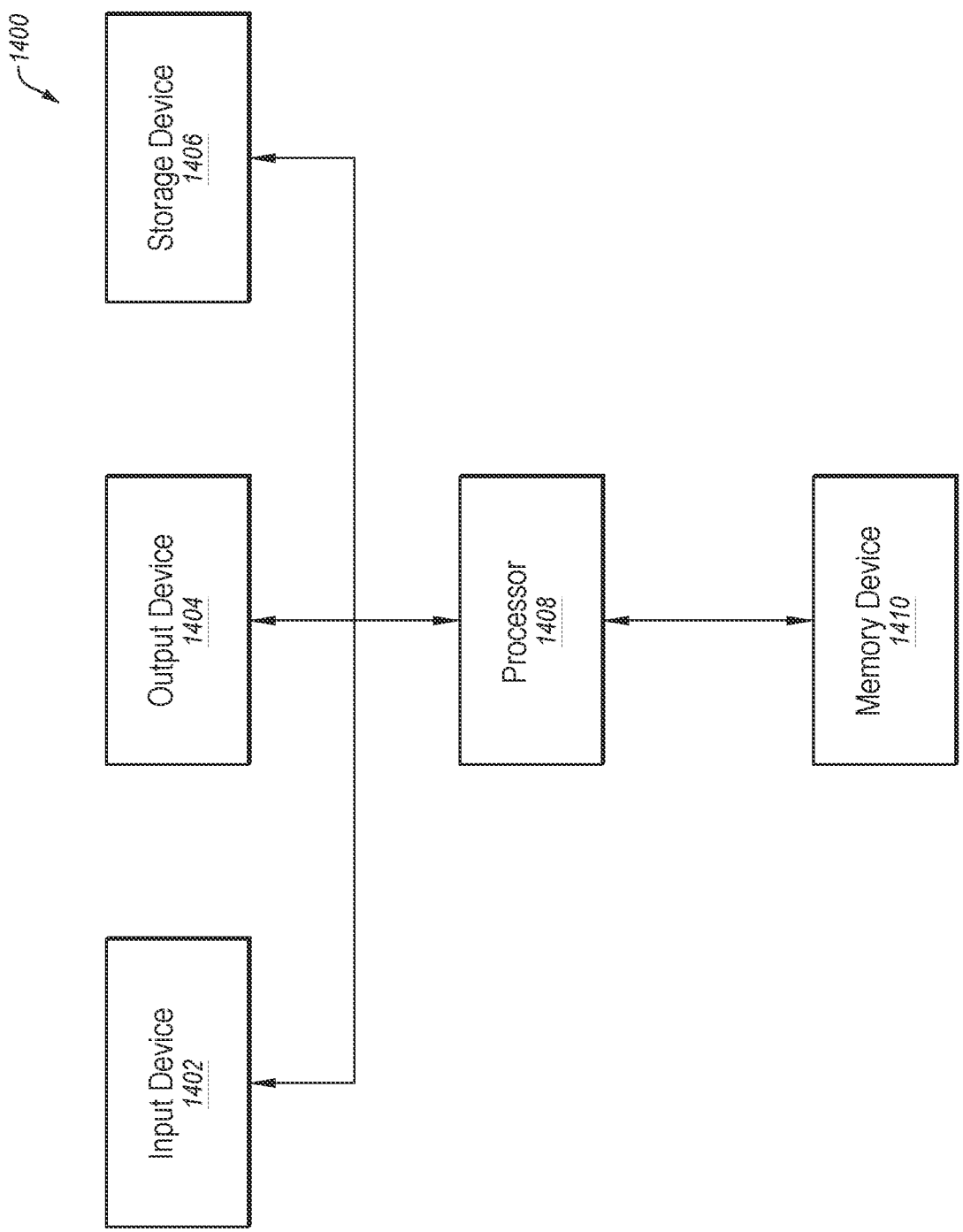
FIG. 14 is a simplified block diagram of an example electronic system, in accordance with various embodiments of the disclosure.

FIG. 14 is a simplified block diagram of an electronic system 1400 implemented according to one or more embodiments described herein. Electronic system 1400 includes at least one input device 1402, which may include, for example, a keyboard, a mouse, or a touch screen. Electronic system 1400 further includes at least one output device 1404, such as a monitor, a touch screen, or a speaker. Input device 1402 and output device 1404 are not necessarily separable from one another. Electronic system 1400 further includes a storage device 1406. Input device 1402, output device 1404, and storage device 1406 may be coupled to a processor 1408. Electronic system 1400 further includes a memory device 1410 coupled to processor 1408. Memory device 1410, which may include memory device 1300 of FIG. 13, may include an array of memory cells. Electronic system 1400 may include, for example, a computing, processing, industrial, or consumer product. For example, without limitation, system 1400 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Various embodiments of the disclosure may include a memory device including a memory array including a number of memory cells. The memory device may also include circuitry coupled to the memory array. The circuitry may be configured to decode a number of received command signals to generate an internal signal, wherein the internal signal is asserted at a first time in response to a received command signal of the number of received command signals. The circuitry may also be configured to cause the internal signal to remain asserted for at least a time duration beginning at the first time. Further, the circuitry may be configured to generate a command enable signal based on the internal signal and a clock signal, wherein the internal signal and the clock signal are associated with different clock domains.

One or more other embodiments of the disclosure include a method including asserting, at a semiconductor device, an internal signal in response to receipt of a command. The method may also include holding the internal signal in an asserted state for at least a predetermined time duration upon assertion of the internal signal. Further, the method may include generating an enable signal based on the internal signal and a clock signal.

In accordance with one or more other embodiments, a method may include transitioning, at a first time, a signal to a high state responsive to receipt of a command, the signal associated with a first clock domain. The method may further include preventing the signal from transitioning from the high state to a low state for at least a time duration beginning at the first time. Further, the method may include conveying the signal and a clock signal associated with a second clock domain to a logic circuit.

Additional embodiments of the disclosure include an electronic system. The electronic system may include at least one input device, at least one output device, and at least one processor device operably coupled to the input device and the output device. The electronic system may also include at least one memory device operably coupled to the at least one processor. The at least one memory device may include circuitry configured to receive a write command and assert an internal write signal at a first time in response to the write command. The circuitry may further be configured to hold the internal write signal in an asserted state for at least a predetermined time duration and generate a write enable signal responsive to the internal write signal and a clock signal.

In accordance with common practice, the various features illustrated in the drawings may not be drawn to scale. The illustrations presented in the disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A memory device, comprising:
    a memory array including a number of memory cells; and
    circuitry coupled to the memory array and configured to:
        assert an internal signal in response to receipt of a read command or a write command;
        cause the internal signal to remain asserted for at least a predetermined time duration including a first time duration for performing an operation associated with the command and an additional time duration; and
        generate a command enable signal based on the internal signal and a clock signal, the internal signal and the clock signal being associated with different clock domains.

2. The memory device of claim 1, wherein the circuitry comprises a flip-flop circuit configured to receive the internal signal and the clock signal and output the command enable signal.

3. The memory device of claim 1, wherein the predetermined time duration is one of 12 tCK or 13 tCK.

4. The memory device of claim 1, wherein the internal signal comprises an internal write signal and the command enable signal comprises a write enable signal.

5. The memory device of claim 1, wherein the memory device comprises a slave device of a three-dimensional stacked (3DS) device, wherein the internal signal is associated with a clock domain of a master device of the 3DS device and the clock signal comprises a number of DQS domain clock pulses.

6. A method, comprising:
    asserting, at a semiconductor device, an internal signal in response to receipt of a read command or a write command;
    holding the internal signal in an asserted state for at least a predetermined time duration including a first time duration for performing an operation associated with the command and an additional time duration; and
    generating an enable signal based on the internal signal and a clock signal.

7. The method of claim 6, further comprising:
    transmitting the command from a master semiconductor device of a three-dimensional stacked (3DS) device to the semiconductor device; and
    receiving the command at the semiconductor device.

8. The method of claim 6, wherein holding the internal signal in the asserted state comprises holding the internal signal in the asserted state for at least 12 tCK or at least 13 tCK.

9. The method of claim 6, wherein:
    asserting the internal signal comprises asserting an internal write signal in response to receipt of the write command;
    holding the internal signal in the asserted state comprises preventing the internal signal from transitioning from the asserted state to a de-asserted state after the first time duration; and
    generating the enable signal comprises generating a write enable signal based on the internal write signal and the clock signal.

10. The method of claim 9, wherein generating the write enable signal based on the internal write signal and the clock signal comprises generating, via a flip-flop, the write enable signal based on the internal write signal and the clock signal.

11. The method of claim 6, wherein generating the enable signal based on the internal signal and the clock signal comprises generating the enable signal based on the internal signal associated with a first clock domain and the clock signal associated with a second, different clock domain.

12. A method of operating a semiconductor device, comprising:
   transitioning a signal associated with a first clock domain to a high state responsive to receipt of a read command or a write command;
   preventing the signal from transitioning from the high state to a low state for at least a predetermined time duration including a first time duration associated with performing a command operation and an additional time duration; and
   conveying the signal and a clock signal associated with a second clock domain to a logic circuit.

13. The method of claim 12, further comprising:
   receiving the signal at a first input of the logic circuit;
   receiving the clock signal at a second input of the logic circuit; and
   generating an output signal via the logic circuit.

14. The method of claim 13, wherein:
   receiving the signal at the first input of the logic circuit comprises receiving an internal write signal at a first input of a flip-flop circuit;
   receiving the clock signal at the second input of the logic circuit comprises receiving a non-continuous clock signal at a second input of the flip-flop circuit; and
   generating the output signal comprises generating a write enable signal via the flip-flop circuit.

15. The method of claim 13, further comprising capturing, via the logic circuit, the signal with the clock signal.

16. The method of claim 15, wherein capturing the signal with the clock signal comprises capturing, via the logic circuit, an internal write signal with a number of DQS domain clock pulses.

17. The method of claim 16, further comprises generating, via the logic circuit, a write enable signal based on the internal write signal and the number of DQS domain clock pulses.

18. A system comprising:
   at least one input device;
   at least one output device;
   at least one processor operably coupled to the input device and the output device; and
   at least one memory device operably coupled to the at least one processor, the at least one memory device comprising circuitry configured to:
      receive a write command;
      assert an internal write signal at a first time in response to the write command;
      hold the internal write signal in an asserted state for a predetermined time duration, the predetermined time duration greater than a time duration for an associated write operation; and
      generate a write enable signal responsive to the internal write signal and a clock signal.

19. The system of claim 18, wherein the circuitry comprises a flip-flop circuit configured to receive the internal write signal and the clock signal and generate the write enable signal.

20. The system of claim 18, wherein the internal write signal is associated with a clock domain and the clock signal comprises a number of DQS domain clock pulses.

* * * * *